(12) United States Patent
Torashima et al.

(10) Patent No.: US 9,525,121 B2
(45) Date of Patent: Dec. 20, 2016

(54) ELECTROMECHANICAL TRANSDUCER AND METHOD OF PRODUCING THE SAME

(75) Inventors: Kazutoshi Torashima, Yokohama (JP); Takahiro Akiyama, Kawasaki (JP); Toshio Tomiyoshi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 816 days.

(21) Appl. No.: 13/436,400

(22) Filed: Mar. 30, 2012

(65) Prior Publication Data

US 2012/0256520 A1 Oct. 11, 2012

(30) Foreign Application Priority Data

Apr. 6, 2011 (JP) .................. 2011-084675

(51) Int. Cl.
| | |
|---|---|
| *H01L 41/00* | (2013.01) |
| *H01L 41/08* | (2006.01) |
| *H01L 41/09* | (2006.01) |
| *H01L 41/316* | (2013.01) |
| *H01L 41/332* | (2013.01) |
| *H02N 1/08* | (2006.01) |

(52) U.S. Cl.
CPC ....... *H01L 41/0815* (2013.01); *H01L 41/0973* (2013.01); *H01L 41/316* (2013.01); *H01L 41/332* (2013.01); *H02N 1/08* (2013.01); *Y10T 29/42* (2015.01)

(58) Field of Classification Search
CPC ...................................... H02N 1/08
USPC ............................................. 310/100
See application file for complete search history.

(56) References Cited

U.S. PATENT DOCUMENTS

| | | | | |
|---|---|---|---|---|
| 5,658,698 | A * | 8/1997 | Yagi et al. ............... | 430/11 |
| 5,870,351 | A | 2/1999 | Ladabaum | |
| 5,894,452 | A * | 4/1999 | Ladabaum et al. ......... | 367/163 |
| 6,443,901 | B1 * | 9/2002 | Fraser .................... | 600/459 |
| 6,945,115 | B1 * | 9/2005 | Wang ................. | G01L 9/0073 73/718 |
| 2002/0009303 | A1 | 1/2002 | Matsumoto | |
| 2002/0093038 | A1 | 7/2002 | Ikeda et al. | |
| 2003/0015040 | A1 * | 1/2003 | Ishio .................. | G01L 9/0073 73/718 |
| 2004/0085858 | A1 * | 5/2004 | Khuri-Yakub .......... | B06B 1/0688 367/181 |
| 2005/0121734 | A1 * | 6/2005 | Degertekin et al. ........ | 257/414 |
| 2006/0116585 | A1 * | 6/2006 | Nguyen-Dinh et al. ...... | 600/459 |
| 2007/0052093 | A1 * | 3/2007 | Machida et al. ........... | 257/735 |
| 2007/0079658 | A1 * | 4/2007 | Wagner .............. | B06B 1/0207 73/627 |
| 2008/0259733 | A1 * | 10/2008 | Machida et al. ............ | 367/140 |

(Continued)

FOREIGN PATENT DOCUMENTS

| | | |
|---|---|---|
| CN | 2247059 Y | 2/1997 |
| CN | 1431715 A | 7/2003 |

(Continued)

*Primary Examiner* — Luke Ratcliffe
*Assistant Examiner* — Hovhannes Baghdasaryan
(74) *Attorney, Agent, or Firm* — Canon USA, Inc. IP Division

(57) ABSTRACT

An electromechanical transducer includes a first electrode; a silicon oxide film disposed on the first electrode; and a vibration film including a silicon nitride film disposed on the silicon oxide film with a space therebetween and a second electrode disposed on the silicon nitride film so as to oppose the first electrode.

35 Claims, 4 Drawing Sheets

(56) References Cited

U.S. PATENT DOCUMENTS

| | | | |
|---|---|---|---|
| 2009/0148967 A1* | 6/2009 | Wodnicki et al. | 438/17 |
| 2009/0322181 A1* | 12/2009 | Machida et al. | 310/300 |

FOREIGN PATENT DOCUMENTS

| | | | |
|---|---|---|---|
| CN | 101544349 A | 9/2009 |
| CN | 101712028 A | 5/2010 |
| CN | 101772383 A | 7/2010 |
| EP | 1992421 A1 | 11/2008 |
| JP | 2007-181190 A | 7/2007 |
| JP | 2008-010961 A | 1/2008 |
| JP | 2008-140867 A | 6/2008 |
| JP | 2008-288813 A | 11/2008 |
| WO | 2009/133961 A1 | 11/2009 |
| WO | 2010/134302 A2 | 11/2010 |
| WO | 2010/134302 A3 | 1/2011 |

* cited by examiner

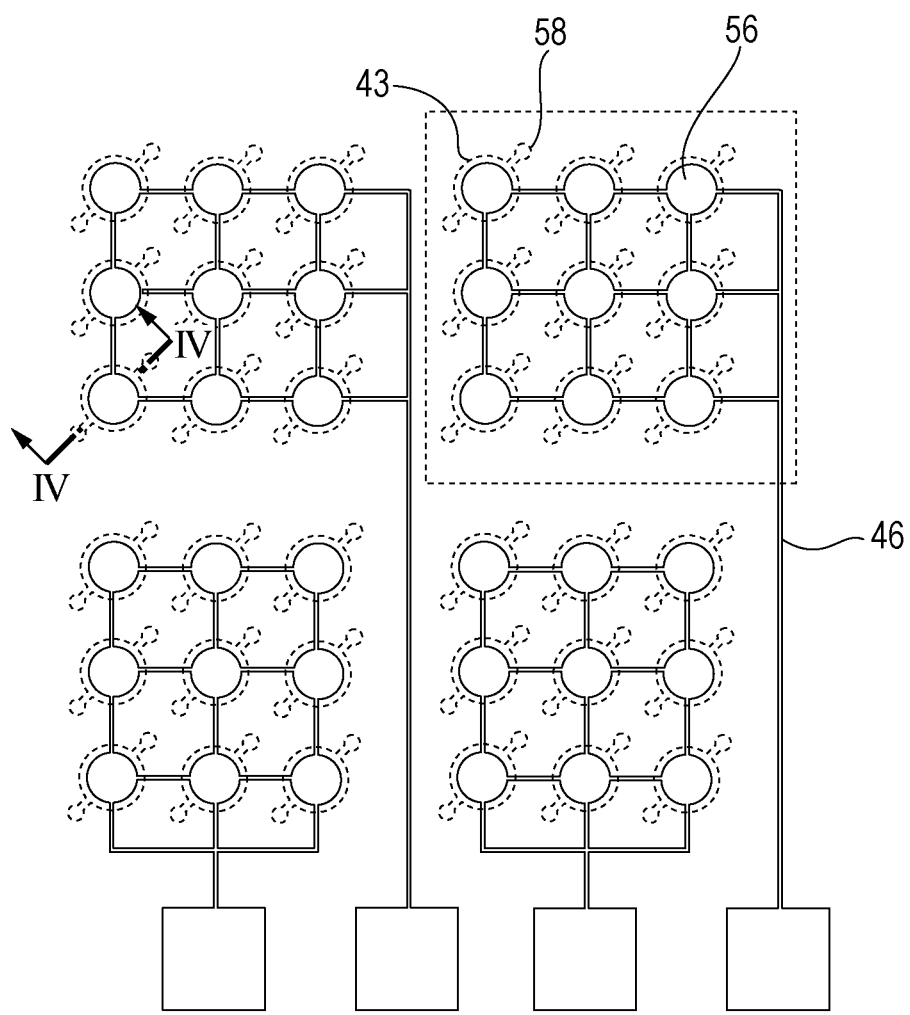

ELECTROMECHANICAL TRANSDUCER AND METHOD OF PRODUCING THE SAME

BACKGROUND OF THE INVENTION

Field of the Invention

One disclosed aspect of the embodiments relates to an electromechanical transducer and a method of producing the transducer. More specifically, one embodiment relates to an electromechanical transducer that is used as an ultrasonic transducer and a method of producing the transducer.

Description of the Related Art

A capacitive electromechanical transducer produced by micromachining technology has been being researched as a substitute for piezoelectric devices. In the capacitive electromechanical transducer, charging of an insulating film constituting an element changes the effective voltage applied between opposing electrodes, and thereby the conversion efficiency varies. The conversion efficiency herein is the efficiency of converting vibration of a vibration film into an electrical signal. The conversion efficiency is increased with an increase in the voltage applied or with a decrease in the distance between the electrodes. The variations among the cells or the elements in conversion efficiency cause variations in sensitivity and bandwidth of the electromechanical transducer.

Japanese Patent Laid-Open No. 2008-288813 describes an electromechanical transducer in which the charge storage (charging) of an insulating film disposed between electrodes is prevented and, at the same time, the pressure resistance of the insulating film between the upper and lower electrodes is improved. In the electromechanical transducer described in Japanese Patent Laid-Open No. 2008-288813, the insulating film being in contact with the lower electrode is a silicon oxide film, and the insulating film (membrane) being in contact with the upper electrode on the space side is also a silicon oxide film. Silicon oxide films hardly accumulate charge, and thereby such a configuration may prevent charging. In addition, a silicon nitride film is disposed between the lower electrode and the upper electrode. The silicon nitride film has a higher relative dielectric constant than that of the silicon oxide film and therefore may have a larger thickness for providing the same capacitance as an insulating film. Accordingly, such a configuration may enhance the dielectric strength.

However, the silicon oxide film has compression stress. In the case of using a silicon oxide film as the membrane that is in contact with the upper electrode on the space side for preventing charging, as in Japanese Patent Laid-Open No. 2008-288813, the vibration film is highly bent due to, for example, buckling. If the bending amount is large, the vibration film may be broken in some cases. In the case of a silicon oxide film, the degree of bending of the vibration film also tends to vary among cells or elements. The variation among the vibration films in bending causes a variation among the elements in sensitivity.

SUMMARY OF THE INVENTION

Accordingly, one embodiment provides an electromechanical transducer in which charging of the element is prevented and also the vibration film has a low tensile stress, and one embodiment also provides a method of producing the transducer.

The electromechanical transducer according to aspects of one embodiment includes a first electrode; a silicon oxide film disposed on the first electrode; and a vibration film including a silicon nitride film disposed on the silicon oxide film with a space therebetween and a second electrode disposed on the silicon nitride film so as to oppose the first electrode.

The method of producing the electromechanical transducer according to aspects of one embodiment includes forming a silicon oxide film on a first electrode; forming a sacrificial layer on the silicon oxide film; forming a silicon nitride film on the sacrificial layer; forming a second electrode on the silicon nitride film; and forming an etching-hole in the silicon nitride film and removing the sacrificial layer through the etching-hole.

One embodiment may provide an electromechanical transducer in which the elements are prevented from being charged, the vibration films are prevented from being largely bent, and the variation among the elements in bending of the vibration films is reduced. The embodiment also provides a method of producing such an electromechanical transducer.

Further features of the present invention will become apparent from the following description of exemplary embodiments with reference to the attached drawings.

BRIEF DESCRIPTION OF THE DRAWINGS

FIG. 3 is a top view illustrating a method of producing an electromechanical transducer to which Example 3 according to aspects of one embodiment may be applied.

DESCRIPTION OF THE EMBODIMENT

An embodiment of the present invention will now be described with reference to the drawings.

Configuration of Electromechanical Transducer

Figure 1A:
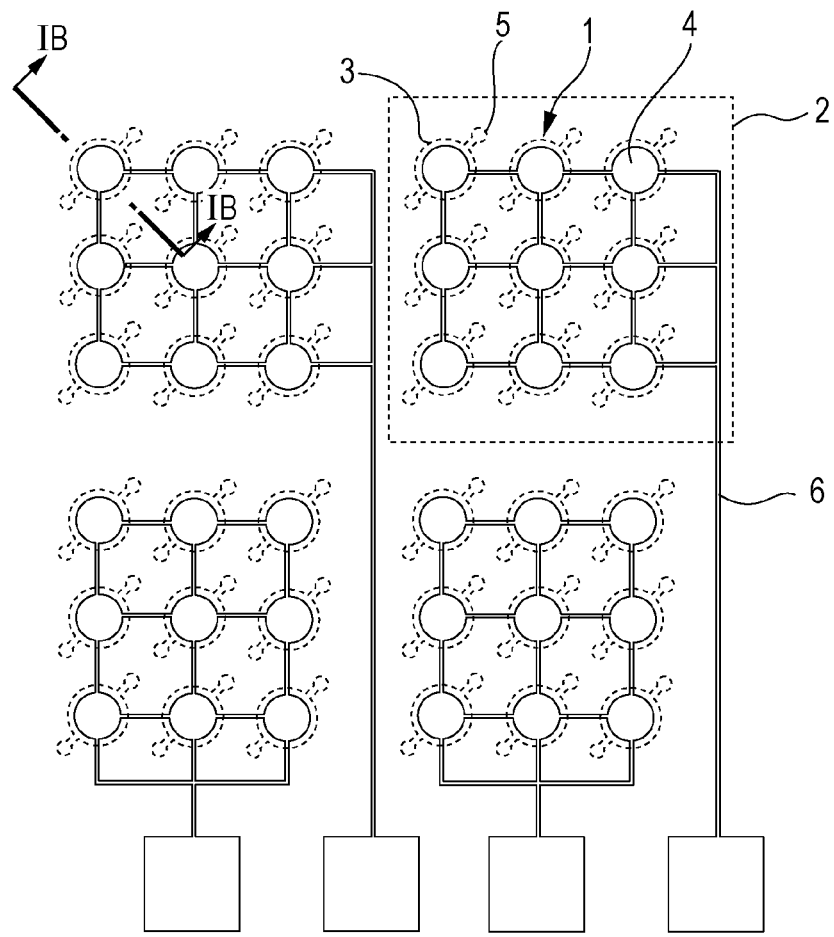
FIG. 1A is a top view illustrating an electromechanical transducer to which Example 1 according to aspects of one embodiment may be applied.
Figure 1B:
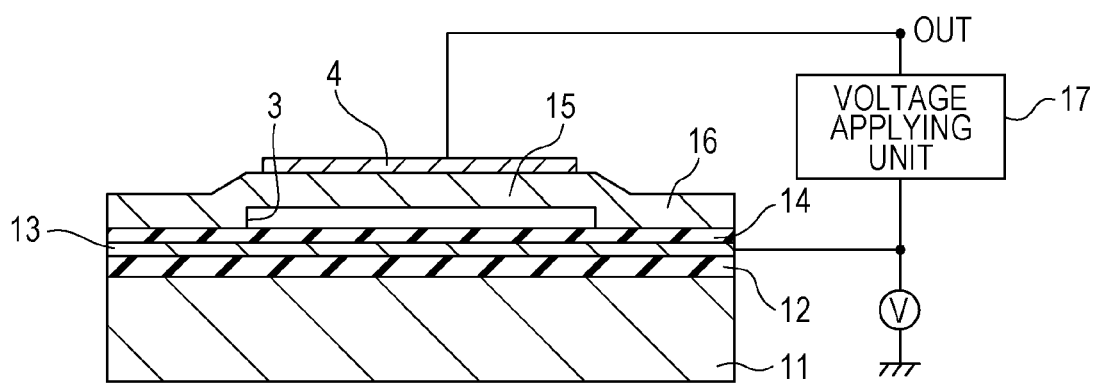
FIG. 1B is a cross-sectional view of the electromechanical transducer, taken along line IB-IB of FIG. 1A.

FIG. 1A is a top view of an electromechanical transducer according to aspects of one embodiment, and FIG. 1B is a cross-sectional view taken along line IB-IB of FIG. 1A. The electromechanical transducer includes a plurality of elements 2 each having cell structures 1. The element 2 is composed of a plurality of cell structures 1 that are electrically connected to one another. In FIG. 1A, each element 2 is composed of nine cell structures, but the number of the cell structures is not particularly limited. The electromechanical transducer shown in FIG. 1A has four elements, but the number of the elements is not particularly limited. The cell structures 1 shown in FIG. 1A are circular, but they may be, for example, square or hexagonal.

The cell structure 1 includes a substrate 11, a first insulating film 12 disposed on the substrate 11, a first electrode 13 disposed on the first insulating film 12, and a second insulating film 14 disposed on the first electrode 13. The cell structure 1 further includes a vibration film composed of a membrane 15 and a second electrode 4. The membrane 15 is supported by a membrane-supporting portion 16. The vibration film is arranged on the second insulating film 14 with a space, a cavity 3, therebetween. The first electrode 13 and the second electrode 4 oppose to each other, and a voltage is applied between the first electrode 13 and the second electrode 4 with a voltage-applying unit 17. The electromechanical transducer may extract an electrical signal from the second electrode 4 of each element separately by using lead wiring 6. Though the lead wiring 6 is used for extracting the electrical signal in this embodiment, for example, through-wiring may be used. In this embodiment, the first electrode 13 is used as a common electrode, and the second electrode 4 is disposed to each element to extract the electrical signal from the second electrode 4 of each element. The configuration may be reversed such that the second electrode 4 is used as a common electrode, and the first electrode 13 is disposed to each element to extract the electrical signal of each element.

Drive Principle of Electromechanical Transducer

The drive principle of an electromechanical transducer according to aspects of the present invention will be described. In the case of receiving ultrasonic waves by the electromechanical transducer, a voltage-applying unit 17 applies a DC voltage to the first electrode 13 so as to cause a potential difference between the first electrode 13 and the second electrode 4. Reception of ultrasonic waves bends the vibration film having the second electrode 4 to change the distance between the second electrode 4 and the first electrode 13 (the distance in the depth direction of the cavity 3), resulting in a change in capacitance. This change in capacitance causes a flow of an electric current in the lead wiring 6. This current is converted into a voltage by a current-voltage conversion device (not shown) to give an input signal of the ultrasonic waves. As described above, the configuration of the lead wiring may be changed so that a DC voltage is applied to the second electrode 4 and that an electrical signal is extracted from the first electrode 13 of each element.

In the case of transmitting ultrasonic waves, a DC voltage and an AC voltage are applied to the first electrode 13 and the second electrode 4, respectively, and the electrostatic force vibrates the vibration film having the membrane 15 and the second electrode 4. This vibration transmits ultrasonic waves. In also the case of transmitting ultrasonic waves, the configuration of the lead wiring 6 may be changed so that a DC voltage is applied to the second electrode 4 and an Ac voltage is applied to the first electrode 13 to vibrate the vibration film.

Characteristics of Electromechanical Transducer According to Aspects of One Embodiment Characteristic portions of the electromechanical transducer according to aspects of one embodiment will be described. In the electromechanical transducer of one embodiment, a silicon nitride film is used as the membrane 15. In the silicon nitride film, stress control is easy. For example, the silicon nitride film may be formed with a low tensile stress in a range such as 0 MPa or more and 300 MPa or less. Accordingly, the vibration film may be prevented from being largely deformed by the residual stress of the silicon nitride film. In addition, the use of the silicon nitride film may reduce the variations among the cells or the elements in bending and mechanical characteristics of the vibration films. In particular, in a silicon nitride film used as the membrane formed with a low stress, the ratio of silicon to nitrogen may be 3:4, which is the chemically ideal membrane composition (stoichiometry), or more.

In the electromechanical transducer according to aspects of the present invention, the second insulating film 14 on the first electrode 13 is a silicon oxide film. The potential-barrier height between the silicon oxide film and the first electrode 13 is higher than that between the silicon nitride film and the first electrode 13, and thereby an electric charge is difficult to flow in the silicon oxide film. Here, a higher potential-barrier height means a higher difficulty in movement of an electric charge at the interface between the first electrode and the insulating film and, therefore, a higher difficulty in flow of an electric current. In the electromechanical transducer according to aspects of the present invention, since the second insulating film 14 on the first electrode 13 is a silicon oxide film, the movement of an electric charge is low, resulting in a reduction in charging.

In particular, the silicon oxide film on the first electrode 13 may have a ratio of silicon to oxygen of near the stoichiometry, i.e., 1:2. In the case of a silicon oxide film having a composition near the stoichiometry, the number of dangling bonds of silicon and oxygen is small, and thereby an electric charge is hardly trapped in the silicon oxide film. The electromechanical transducer is therefore further prevented from being charged.

However, a silicon oxide film having near stoichiometry tends to have a compressive stress. Accordingly, in the configuration herein, a silicon oxide film for preventing charging is disposed on the first electrode, and the film is not used as the membrane on the second electrode on the cavity side. Accordingly, the vibration film may be inhibited from being largely deformed and thereby may be prevented from being charged.

As described above, in the case where the silicon nitride film used as the membrane is formed with a low stress, the ratio of silicon to nitrogen may be higher than the stoichiometry (i.e., 3:4). Consequently, the number of dangling bonds of silicon and oxygen increases, and thereby an electric charge is easily trapped in the silicon nitride film, resulting in easy occurrence of charging. However, in the electromechanical transducer according to aspects of the present invention, a silicon oxide film for preventing charging is disposed on the first electrode, and thereby charging may be reduced even if a silicon nitride film is used as the membrane.

The configuration described above may inhibit the vibration film from being largely deformed, may reduce the variations among the cells or the elements in bending of the vibration films, and also may reduce charging of the electromechanical transducer.

An example of each component of the electromechanical transducer will be described. The substrate 11 according to aspects of the present invention may be a substrate having a low surface roughness and may be, for example, a silicon substrate or a glass substrate. In the case of using an electrically conductive substrate such as a silicon substrate as the substrate 11, the substrate 11 may also serve as the first electrode 13. In the case of using an insulating substrate such as a glass substrate as the substrate 11, the first insulating film 12 may not be provided.

The first electrode 13 may be made of an electrically conductive material having a low surface roughness, for example, titanium or aluminum.

If the second electrode 4 has a high residual stress, the vibration film is largely deformed. Accordingly, the second electrode 4 should be made of a material that has a low residual stress. In addition, the second electrode 4 should be made of a material that is not deteriorated or does not increase the stress by the temperature or other conditions in film formation for sealing the etching-holes 5 in the production process described below. Furthermore, the second electrode 4 should be made of a material having etching resistance so that etching of the sacrificial layer may be performed in the state that the second electrode is exposed. Accordingly, for example, titanium may be used.

A driving form of the electromechanical transducer according to aspects of the present invention will be described. In the present invention, the voltage-applying unit 17 may apply a voltage in such a manner that the potential of the first electrode 13 is lower than that of the second electrode 4. In a configuration where electrons flow in from the side of the first electrode 13 being in contact with a silicon oxide film, the inflow amount of electrons is small, compared with the case where electrons flow in from the side of the second electrode 4 being in contact with a silicon nitride film. Accordingly, the amount of charge accumulated in the silicon oxide film or the silicon nitride film may be reduced. Thus, charging of the electromechanical transducer may be further reduced by this configuration.

Furthermore, the electric field intensity applied to the silicon nitride film may be 2 MV/cm or less. In such a configuration, the conduction in the silicon nitride film is nearly Ohmic, and thereby a sudden flow of a large electric current does not occur by application of the electric field intensity. Consequently, the charge does not suddenly move, resulting in further prevention of charging. The Ohmic conduction herein refers to that an electric current flows proportionally to the voltage applied. In particular, in the case where the membrane 15 is in contact with the second insulating film 14 on the first electrode 13, since the relative dielectric constant of the silicon nitride film is higher than that of the silicon oxide film, the electric field intensity applied to the silicon nitride film is higher than that applied to the silicon oxide film. In this configuration, the electric field intensity applied to the silicon nitride film is 2 MV/cm or less, which may prevent charging. The electric field intensity varies depending on the thickness of the silicon nitride film, the applied voltage, the space, or the thickness of the silicon oxide film. Accordingly, in the case of applying a voltage of 200 V or less, the silicon oxide film may have a thickness of 50 to 200 nm, and the silicon nitride film used as a first membrane may have a thickness of 300 to 800 nm.

Method of Producing Electromechanical Transducer

The method of producing an electromechanical transducer according to aspects of one embodiment will be described with reference to FIGS. 3 and 4A to 4F. FIG. 3 is a top view of an electromechanical transducer according to aspects of the present invention, and FIGS. 4A to 4F are cross-sectional views taken along line IV-IV of FIG. 3.

Figure 4A:
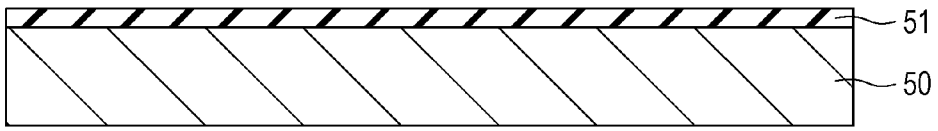
FIGS. 4A to 4F are cross-sectional views taken along line IV-IV of FIG. 3 for illustrating the method of producing the electromechanical transducer to which Example 3 of the present invention may be applied.

As shown in FIG. 4A, a first insulating film 51 is formed on a substrate 50. In the case where the substrate 50 is an electrically conductive substrate such as a silicon substrate, the first insulating film 51 is formed for insulating the first electrode. In the case where the substrate 50 is an insulating substrate such as a glass substrate, the first insulating film 51 may not be formed. The substrate 50 should be a substrate having a low surface roughness. If the surface roughness is high, it is transferred to the films in the film-forming steps posterior to this step, and also the distance between the first electrode and the second electrode due to the surface roughness varies among the cells or the elements. This variation causes a variation in conversion efficiency, and thereby variations among the cells or the elements in sensitivity and bandwidth are caused. In addition, if the surface roughness is high, electric field concentration and breakdown readily occur. Accordingly, the substrate 50 should be a substrate having a low surface roughness.

Figure 4B:
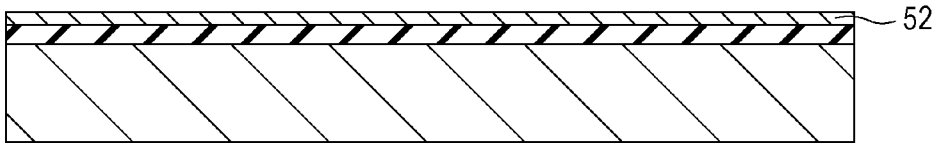

Subsequently, as shown in FIG. 4B, a first electrode 52 is formed. The first electrode 52 may be made of an electrically conductive material having a low surface roughness, for example, titanium or aluminum. As in the substrate 50, if the surface roughness of the first electrode is high, the distance between the first electrode and the second electrode due to the surface roughness varies among the cells or among the elements or breakdown readily occurs. Accordingly, the first electrode 52 should be made of an electrically conductive material having a low surface roughness. In particular, titanium has high heat resistance and is thereby hardly deteriorated and hardly increases the surface roughness by the temperature in the film-forming steps posterior to this step. Accordingly, titanium may be used as the first electrode 52.

Figure 4C:
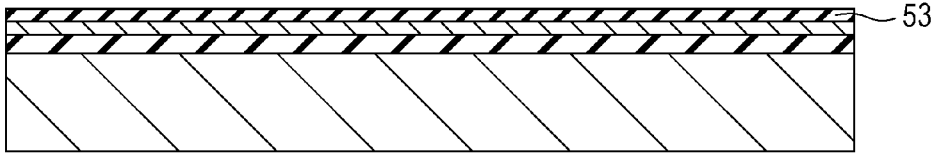

Subsequently, as shown in FIG. 4C, a second insulating film 53 is formed. The second insulating film 53 is a silicon oxide film. The silicon oxide film may be formed on the first electrode 52 at a low temperature (about 200 to 400° C.) by plasma enhanced chemical vapor deposition (PE-CVD).

Figure 4D:
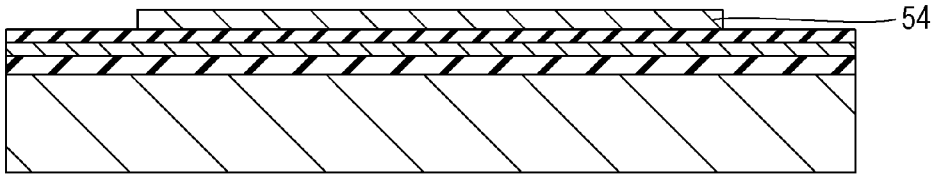

Subsequently, as shown in FIG. 4D, a sacrificial layer 54 is formed on the silicon oxide film. The sacrificial layer 54 should be made of a material having a low surface roughness. As in the substrate 50, if the surface roughness of the sacrificial layer is high, the distance between the first electrode and the second electrode due to the surface roughness varies among the cells or among the elements or breakdown readily occurs. Accordingly, the sacrificial layer should be made of a material having a low surface roughness. In addition, in order to shorten the etching time for removing the sacrificial layer, the sacrificial layer should be made of a material having a high etching rate. Furthermore, the sacrificial layer is required to be made of a material such that the second insulating film 53, the membrane 55, and the second electrode 56 are hardly etched by the etching solution or etching gas for removing the sacrificial layer.

If the second insulating film 53 and the membrane 55 are etched by the etching solution or etching gas for removing the sacrificial layer 54, the thickness of the vibration film varies to cause a variation in the distance between the first electrode and the second electrode. The variation in the thickness of the vibration film and the variation in the distance between the first electrode and the second electrode cause variations among the cells or the elements in sensitivity and bandwidth. The material for the sacrificial layer 54 may be chromium, where the surface roughness is low, and an etching solution that does not etches the second insulating film 53, the membrane 55, and the second electrode 56 may be used.

Figure 4E:
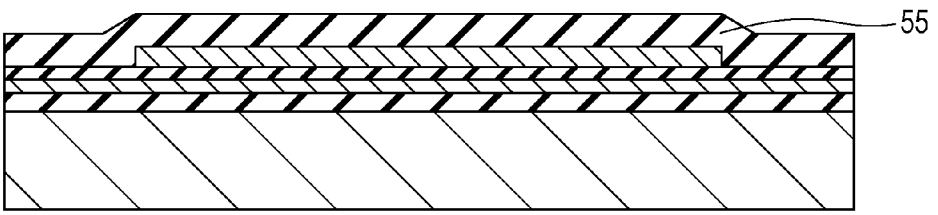

Subsequently, as shown in FIG. 4E, a membrane 55 is formed on the sacrificial layer 54. The membrane 55 is a silicon nitride film. In silicon nitride, the stress may be easily controlled, and, therefore, the membrane 55 may be formed at a low tensile stress, such as 300 MPa or less. As described above, if the membrane has a compression stress, the membrane causes buckling and is largely deformed. If the membrane has a low spring constant, after formation of the cavity 43 (see FIG. 3), the membrane 55 may adhere to the first electrode 52 side (sticking).

The sticking occurs by, for example, the residual stress of the membrane, surface tension due to water evaporation during etching of the sacrificial layer as in Example 3 described below, electrostatic force, or moisture absorption due to hydroxyl groups on the surface. In the method of producing an electromechanical transducer according to aspects of one embodiment, the sacrificial layer is etched by wet etching, and therefore sticking tends to occur. In particular, in an electromechanical transducer having a frequency bandwidth of 0.3 to 20 MHz, the cavity depth is 50 to 300 nm, and sticking tends to occur. Accordingly, it is important to form a silicon nitride film at a low tensile stress as the membrane 55.

The silicon nitride film may be formed by PE-CVD. PE-CVD may form a silicon nitride film at a low temperature (200 to 400° C.) compared to low pressure chemical vapor deposition (LPCVD). In addition, the Young's modulus of a silicon nitride film formed by PE-CVD may be 180 GPa or more, and therefore the stiffness of the membrane may be increased, resulting in a decrease in sticking.

Figure 4F:
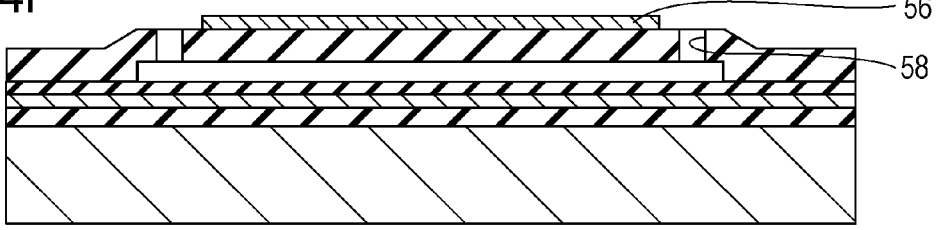

Subsequently, as shown in FIG. 4F, a second electrode 56 is formed on the membrane 55 (the silicon nitride film). Etching-holes 58 are formed in the membrane, and a sacrificial layer 54 is removed.

In the case of sealing the etching-holes after removal of the sacrificial layer 54, the second electrode 56 should be made of a material that is not deteriorated or does not increase the stress by the temperature or other conditions in film formation for sealing the etching-holes. If the etching resistance is low, the sacrificial layer 54 is required to be removed by etching with, for example, a photoresist applied for protecting the second electrode 56. However, in the case of using the photoresist or the like, the membrane tends to cause sticking due to the stress of the photoresist or the like. Accordingly, the second electrode 56 should be made of a material having etching resistance so that the sacrificial layer may be etched in the state that the second electrode 56 is exposed without using photoresist or the like. Examples of such a material include titanium.

The etching-holes 58 may be sealed by forming a film. In the case of sealing by film formation, the film for sealing the etching-holes 58 deposits also on the second electrode. The film deposited on the second electrode 56 may be used as a film constituting a vibration film having desired mechanical characteristics or may be removed to form a vibration film.

In the case of sealing the etching-holes, after the sealing of the etching-holes, wiring 46 that is connected to the second electrode 56 is formed (not shown). The material of the wiring may be, for example, aluminum.

In one embodiment, the etching-holes 58 may not be sealed. In the case of not sealing the etching-holes 58, wiring 46 that is connected to the second electrode 56 is formed on the membrane 55 in the step of forming the second electrode. Subsequently, the sacrificial layer 54 is removed through the etching-holes.

In the electromechanical transducer produced by this method, variations in the mechanical characteristics and bending of the vibration film of the electromechanical transducer may be decreased, and also charging may be prevented. Accordingly, an electromechanical transducer having reduced variations in sensitivity and bandwidth may be produced.

EXAMPLES

One embodiment will be described in detail by using more specific examples.

Example 1

The configuration of the electromechanical transducer of Example 1 according to aspects of the present invention will be described with reference to FIGS. 1A and 1B. FIG. 1A is a top view illustrating an electromechanical transducer, and FIG. 1B is a cross-sectional view taken along line IB-IB of FIG. 1A.

A cell structure 1 includes a silicon substrate 11 having a thickness of 300 μm, a first insulating film 12 disposed on the silicon substrate 11, a first electrode 13 disposed on the first insulating film 12, and a second insulating film 14 on the first electrode 13. The cell structure 1 further includes a vibration film composed of a membrane 15 and a second electrode 4 disposed on the membrane 15, wherein the membrane 15 is disposed on the second insulating film 14 with a cavity 3 therebetween; and a membrane-supporting portion 16 supporting the membrane 15. A voltage is applied between the first electrode 13 and the second electrode 4 with a voltage-applying unit.

The first insulating film 12 of this Example is a silicon oxide film having a thickness of 1 lam formed by thermal oxidation. The second insulating film 14 is a silicon oxide film formed by PE-CVD. The first electrode 13 and second electrode 4 are made of titanium and have thicknesses of 50 nm and 100 nm, respectively. The membrane 15 is a silicon nitride film having a tensile stress of 100 MPa or less formed by PE-CVD. The second insulating film 14 is a silicon oxide film having a thickness of 100 nm formed by PE-CVD.

The membrane 15 has a diameter of 32 μm and a thickness of 0.5 μm. The second electrode 4 has a diameter of 26 μm. The cavity 3 has a depth of 0.2 μm.

As in this Example, when the second insulating film 14 on the first electrode 13 is a silicon oxide film, charging may be prevented. In this Example, charging is thus prevented, and thereby the variation among the elements in effective voltage applied between the first electrode and the second electrode may be reduced to 0.1 V or less. Furthermore, the membrane 15 is a silicon nitride film with a low stress, and thereby the variations among the cells or the elements in bending and mechanical characteristics of the vibration films may be decreased. In this Example, the variations among the cells or the elements in bending of the vibration films may be controlled to ±2 nm or less. Consequently, the variation among the elements in sensitivity may be controlled within 1 dB.

The electromechanical transducer of this Example may extract an electrical signal from the second electrode 4 of each element separately by using lead wiring 6. In the case of receiving ultrasonic waves, the voltage-applying unit 17 applies a DC voltage to the first electrode 13 so as to cause a potential difference between the first electrode 13 and the second electrode 4. Reception of ultrasonic waves deforms the vibration film having the second electrode 4 and the membrane 15 to change the depth of the cavity 3 between the second electrode 4 and the first electrode 13, resulting in a change in capacitance. This change in capacitance causes a flow of an electric current in the lead wiring 6. This current is converted into a voltage by a current-voltage conversion device (not shown) to give an input signal of the ultrasonic waves.

In the case of transmitting ultrasonic waves, a DC voltage and an AC voltage are applied to the first electrode and the second electrode, respectively, and the electrostatic force vibrates the vibration film. This vibration transmits ultrasonic waves.

In the electromechanical transducer according to aspects of the present invention, charging may be prevented, and the variations in mechanical characteristics and bending of the vibration films may be decreased. Consequently, the variation among the elements in sensitivity may be reduced to 1 dB or less.

Example 2

Figure 2A:
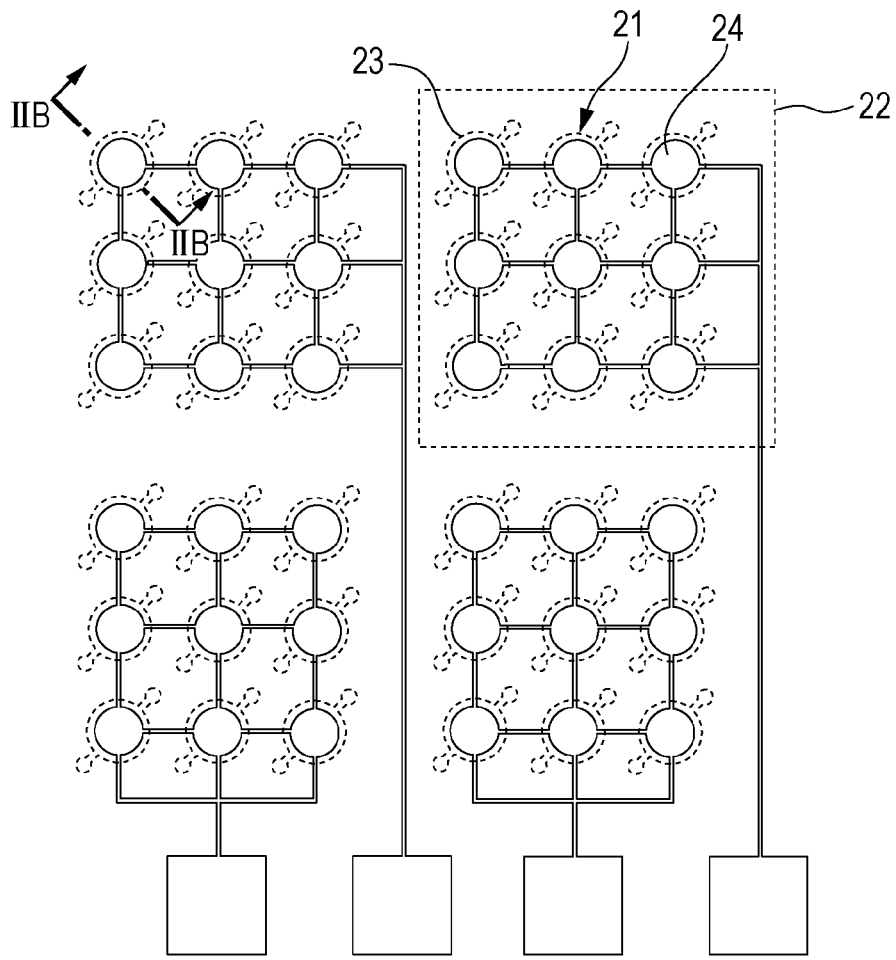
FIG. 2A is a top view illustrating an electromechanical transducer to which Example 2 according to aspects of one embodiment may be applied.
Figure 2B:
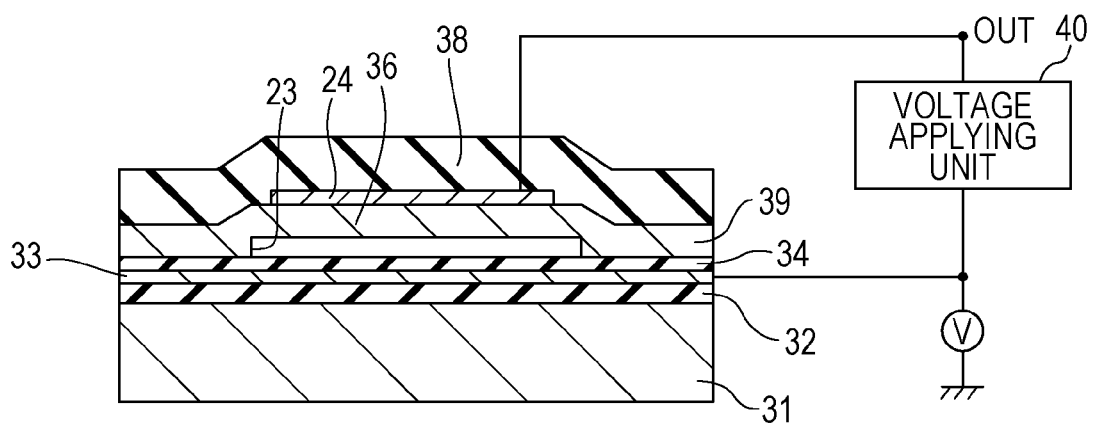
FIG. 2B is a cross-sectional view of the electromechanical transducer, taken along line IIB-IIB of FIG. 2A.

The configuration of the electromechanical transducer of Example 2 according to aspects of one embodiment will be described with reference to FIGS. 2A and 2B. The configuration of the electromechanical transducer shown in FIGS. 2A and 2B is different from that in Example 1 in that the vibration film has a three-layer structure. FIG. 2A is a top view illustrating the electromechanical transducer according to aspects of one embodiment, and FIG. 2B is a cross-sectional view taken along line IIB-IIB of FIG. 2A.

The cell structure 21 of this Example includes a silicon substrate 31 having a thickness of 300 µm, a first insulating film 32 disposed on the silicon substrate 31, a first electrode 33 disposed on the first insulating film 32, and a second insulating film 34 on the first electrode 33. The cell structure 21 further includes a vibration film, composed of a first membrane 36, a second membrane 38, and a second electrode 24, disposed on the second insulating film 34 with a cavity 23 therebetween; and a membrane-supporting portion 39 supporting the first membrane 36. The element 22 of this Example is composed of nine cell structures. A voltage is applied between the first electrode 33 and the second electrode 24 with a voltage-applying unit 40.

The first insulating film 32 is a silicon oxide film having a thickness of 1 µm formed by thermal oxidation. The second insulating film 34 is a silicon oxide film having a thickness on 0.1 µm formed by PE-CVD. The first electrode 33 and second electrode 24 are made of titanium and have thicknesses of 50 nm and 100 nm, respectively. The first membrane 36 and the second membrane 38 are silicon nitride films each having a tensile stress of 200 MPa or less formed by PE-CVD. The first membrane 36 and the second membrane 38 each have a diameter of 44 µm and have thicknesses of 0.4 µm and 0.7 µm, respectively. The second electrode 24 has a diameter of 38 µm. The cavity 23 has a depth of 0.18 µm.

In the electromechanical transducer in this Example, the second insulating film 34 on the first electrode 33 is a silicon oxide film, and thereby charging is prevented. Furthermore, the first membrane is a silicon nitride film with a low stress, and thereby the variations among the cells or the elements in bending and mechanical characteristics of the vibration films may be decreased.

The vibration film of this Example has a second membrane 38 disposed on the second electrode 24 on the opposite side of the cavity 23. Accordingly, the frequency characteristics may be controlled by adjusting the total thickness of the vibration film through control of the second membrane 38. Since the second electrode 24 is disposed on the first membrane 36, the first membrane 36 is required to have a lower thickness for reducing the distance between the first and the second electrodes. Accordingly, the total thickness of the vibration films may be controlled by adjusting the thickness of the second membrane 38. In this Example, the second membrane 38 is a silicon nitride film like the first membrane 36. Though the second membrane 38 may be a film other than a silicon nitride film, the vibration film may have a low tensile stress when the second membrane 38 is also a silicon nitride film.

The electromechanical transducer of this Example will be described by a case of applying a voltage of −60 V to the first electrode 33 with the voltage-applying unit 40. In this case, the potential of the first electrode 33 is lower than the potential of the second electrode 24. In a configuration where electrons flow in from the side of the first electrode 33 being in contact with a silicon oxide film, the inflow amount of electrons is small, compared with the case where electrons flow in from the side of the second electrode 24 being in contact with a silicon nitride film. Accordingly, the amount of charge accumulated in the silicon oxide film or the silicon nitride film may be reduced. Thus, charging of the electromechanical transducer may be further reduced by this configuration.

Furthermore, as in this Example, in the case where the first membrane 36 has a thickness of 0.4 µm and a voltage of −60 V is applied to the first electrode 33, the electric field intensity applied to the silicon nitride film is 2 MV/cm or less. In particular, even if the first membrane is in contact with the second insulating film, the electric field intensity applied to the silicon nitride film is 2 MV/cm or less as long as the voltage is 115 V or less. Accordingly, the charging is further prevented.

In the configuration of this Example, charging may be prevented, and the variations in mechanical characteristics and bending of the vibration films may be reduced. Consequently, the variation among the elements in sensitivity may be controlled to 0.5 dB or less. However, the relationship of potential between the electrodes and the electric field intensity of the first membrane are not limited to those of this Example. For example, a configuration in which the potential of the first electrode 33 is lower than that of the second electrode 24 or a configuration in which the electric field intensity is 2 MV/cm or less may be applied to Example 1.

Example 3

Example 3 according to aspects of one embodiment will be described. This Example relates to a method of producing an electromechanical transducer. The method of the present invention will be described with reference to FIGS. 3 and 4A to 4F. FIG. 3 is a top view of an electromechanical transducer of the present invention, and FIGS. 4A to 4F are cross-sectional views taken along line IV-IV of FIG. 3.

As shown in FIG. 4A, a first insulating film 51 is formed on a substrate 50. The substrate 50 is a silicon substrate having a thickness of 300 µm. The first insulating film 51 is a silicon oxide film having a thickness of 1 µm formed by thermal oxidation for providing insulation between the first electrode 52 and the substrate 50.

Subsequently, as shown in FIG. 4B, a first electrode 52 is formed. The first electrode 52 is made of titanium and has a thickness of 50 nm and a root mean surface roughness (Rms) of 2 nm or less. The first electrode 52 may be formed by sputtering or deposition of titanium.

Subsequently, as shown in FIG. 4C, a second insulating film 53 is formed. The second insulating film 53 is a silicon oxide film formed by PE-CVD so as to have a thickness of 0.1 µm and a root mean surface roughness (Rms) of 2 nm or less. The second insulating film 53 may prevent electrical short between the first electrode 52 and the second electrode 56 or breakdown when a voltage is applied between the first electrode 52 and the second electrode 56. In addition, the potential-barrier height between the silicon oxide film and the first electrode 52 is higher than that between the silicon nitride film and the first electrode 52, and thereby an electric charge is difficult to flow in the silicon oxide film. The second insulating film 53 on the first electrode 52 is a silicon oxide film, and thereby charging of the electromechanical transducer of one embodiment may be prevented.

Subsequently, as shown in FIG. 4D, a sacrificial layer 54 is formed. The sacrificial layer 54 is made of chromium and has a thickness of 0.2 μm and a root mean surface roughness (Rms) of 1.5 nm or less. The diameter of the sacrificial layer 54 is 40 μm.

Subsequently, as shown in FIG. 4E, a membrane 55 is formed. The membrane 55 is a nitride film having a thickness of 0.5 μm formed by PECVD. The membrane 55 has a residual stress of 200 MPa. The membrane-supporting portion is formed in this step of forming the membrane 55.

Subsequently, as shown in FIG. 4F, a second electrode 56 is formed, and etching-holes 58 are further formed in the membrane. The second electrode 56 is made of titanium and has a thickness of 0.1 μm and a residual stress of 200 MPa or less. Titanium does not cause an increase in the surface roughness and a change in the stress by the temperature when a second membrane is formed as in Example 2. In addition, titanium is not etched when the sacrificial layer 54 is removed, and thereby the sacrificial layer 54 may be removed without protecting the second electrode 56 with a resist, for example.

Subsequently, the sacrificial layer 54 is removed through the etching-holes 58. The sacrificial layer 54 is removed using a chromium etchant (mixed acid of cerium ammonium nitrate, perchloric acid, and water). In this Example, the second insulating film 53 is a silicon oxide film, the membrane 55 is a silicon nitride film, and the sacrificial layer 54 is made of chromium. Accordingly, the second insulating film 53, the membrane 55, and the second electrode 52 are not etched in the etching of the sacrificial layer. Consequently, the variation in thickness of the vibration film and the variation in distance between the first electrode and the second electrode may be reduced. Thus, the variations among the cells or the elements in sensitivity and bandwidth may be reduced.

Furthermore, the etching-holes 58 are sealed with a silicon nitride film formed by PE-CVD (not shown). This sealing may be performed in the step of forming the second membrane described in Example 2. Subsequently, wiring 46 connecting to the first electrode and the second electrode is formed using aluminum as the wiring material.

In the electromechanical transducer produced by this method, the variations in mechanical characteristics and bending of the vibration films of the electromechanical transducer may be reduced, and also charging of the electromechanical transducer may be prevented. Thus, an electromechanical transducer in which the variations among the cells or the elements in sensitivity and bandwidth are reduced may be produced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-084675 filed Apr. 6, 2011, which is hereby incorporated by reference herein in its entirety.

What is claimed is:

1. An electromechanical transducer comprising a plurality of cells, the cell including:
    a first electrode;
    a silicon oxide film;
    a vibration film that includes a silicon nitride film and a second electrode; and
    a voltage-applying unit for applying a voltage between the first electrode and the second electrode;
    the voltage-applying unit applies a voltage so that the silicon nitride film is applied with an electric field intensity of 2 MV/cm or less;
    wherein a space is formed between the silicon oxide film and the silicon nitride film in a direction in which the silicon oxide film and the silicon nitride film are stacked,
    wherein the silicon oxide film is contacted with the first electrode and the space,
    wherein the silicon nitride film is contacted with the second electrode and the space, and
    wherein the voltage-applying unit applies the voltage so that a potential of the first electrode is lower than a potential of the second electrode.

2. The electromechanical transducer according to claim 1, wherein the silicon nitride film has a tensile stress higher than 0 MPa and not higher than 300 MPa.

3. The electromechanical transducer according to claim 1, wherein the vibration film further includes a silicon nitride film disposed on the second electrode on the opposite side of the space.

4. The electromechanical transducer according to claim 1, wherein the silicon oxide film has a thickness of 50 to 200 nm.

5. The electromechanical transducer according to claim 1, wherein the silicon nitride film has a thickness of 300 to 800 nm.

6. The electromechanical transducer according to claim 1, wherein a ratio of silicon to nitrogen in the silicon nitride film is higher than 3:4.

7. The electromechanical transducer according to claim 1, wherein a ratio of silicon to oxygen in the silicon oxide film is close to 1:2.

8. The electromechanical transducer according to claim 1, wherein the space has a depth of 50 nm to 300 nm.

9. The electromechanical transducer according to claim 1, wherein the first electrode has a root mean surface roughness (Rms) of 2 nm or less.

10. The electromechanical transducer according to claim 1, wherein the silicon oxide film has a root mean surface roughness (Rms) of 2 nm or less.

11. The electromechanical transducer according to claim 1, wherein the first electrode contains at least one of titanium and aluminum.

12. The electromechanical transducer according to claim 1, wherein the second electrode contains titanium.

13. The electromechanical transducer according to claim 1, wherein a variation among the cells in bending is ±2 nm or less.

14. The electromechanical transducer according to claim 1, wherein a variation among the cells in sensitivity is 1 dB or less.

15. The electromechanical transducer according to claim 1, further comprising a plurality of elements which has the plurality of cells,
    wherein a variation among the elements in effective voltage applied between the first electrode and the second electrode is 0.1 V or less.

16. The electromechanical transducer according to claim 1, wherein the space is not filled with a solid.

17. The electromechanical transducer according to claim 1, wherein the silicon nitride film has a tensile stress higher than 0 MPa and not higher than 200 MPa.

18. The electromechanical transducer according to claim 1, wherein at least one of the first electrode and the second electrode of each of the plurality of cells is a common electrode.

19. The apparatus according to claim 1, wherein the space is sealed.

20. The electromechanical transducer according to claim 1, wherein the plurality of cells is two-dimensionally arranged to form an element.

21. The electromechanical transducer according to claim 1, wherein at least one of the first electrode and the second electrode is a common electrode shared by the plurality of cells.

22. The electromechanical transducer according to claim 1, wherein the first electrode has a negative voltage.

23. The electromechanical transducer according to claim 1, wherein the electromechanical transducer receives an ultrasonic wave while the voltage-applying unit applies a DC voltage so as to cause a potential difference between the first electrode and the second electrode.

24. The electromechanical transducer according to claim 1, wherein the electromechanical transducer transmits an ultrasonic wave while the voltage-applying unit applies a DC voltage to the first electrode and an AC voltage to the second electrode.

25. An electromechanical transducer comprising a plurality of cells, the plurality of cells including:

a first electrode;

a first insulating film; and a vibration film that includes a second insulating film and a second electrode;

wherein the first electrode, the first insulating film, the second insulating film and the second electrode are arranged in order from the first electrode, wherein the second insulating film has a tensile stress of higher than 0 MPa and not higher than 300 MPa, wherein the first insulating film has a higher potential barrier than that of the second insulating film, wherein a space is formed between the first insulating film and the second insulating film in a direction in which the first insulating film and the second insulating film are stacked, wherein the first insulating film is contacted with the first electrode and the space, and wherein the second insulating film is contacted with the second electrode and the space.

26. The electromechanical transducer according to claim 25, wherein a voltage is applied between the first electrode and the second electrode so that the potential of the first electrode is lower than the potential of the second electrode.

27. The electromechanical transducer according to claim 25, wherein a voltage is applied between the first electrode and the second electrode so that the silicon nitride film is applied with an electric field intensity of 2 MV/cm or less.

28. The electromechanical transducer according to claim 25, wherein the first insulating film is silicon oxide film.

29. The electromechanical transducer according to claim 25, wherein the second insulating film is silicon nitride film.

30. The electromechanical transducer according to claim 28, wherein a ratio of silicon to oxygen is close to 1:2.

31. The electromechanical transducer according to claim 29, wherein a ratio of silicon to nitrogen is higher than 3:4.

32. The electromechanical transducer according to claim 25, further comprising a first insulating film disposed on the first electrode on the opposite side of the space.

33. The electromechanical transducer according to claim 25, wherein the first insulating film has a root mean surface roughness (Rms) of 2 nm or less.

34. The electromechanical transducer according to claim 25, wherein the first insulating film has a thickness of 50 to 200 nm.

35. The electromechanical transducer according to claim 25, wherein the second insulating film has a thickness of 300 to 800 nm.

* * * * *